(12) United States Patent
Nakai

(10) Patent No.: US 8,436,696 B2
(45) Date of Patent: May 7, 2013

(54) SURFACE ACOUSTIC WAVE DEVICE AND COMMUNICATION DEVICE

(75) Inventor: Tsuyoshi Nakai, Kyoto (JP)

(73) Assignee: Kyocera Corporation, Kyoto (JP)

( * ) Notice: Subject to any disclaimer, the term of this patent is extended or adjusted under 35 U.S.C. 154(b) by 536 days.

(21) Appl. No.: 12/667,015

(22) PCT Filed: May 30, 2008

(86) PCT No.: PCT/JP2008/060082
§ 371 (c)(1),
(2), (4) Date: May 18, 2010

(87) PCT Pub. No.: WO2009/001651
PCT Pub. Date: Dec. 31, 2008

(65) Prior Publication Data
US 2010/0259341 A1    Oct. 14, 2010

(30) Foreign Application Priority Data

Jun. 28, 2007 (JP) ................................. 2007-171015

(51) Int. Cl.
*H03H 9/72* (2006.01)
*H03H 9/64* (2006.01)

(52) U.S. Cl.
USPC ......................... 333/133; 333/195; 310/313 D

(58) Field of Classification Search ................ 333/133, 333/193–196; 310/313 B
See application file for complete search history.

(56) References Cited

U.S. PATENT DOCUMENTS

| | | | |
|---|---|---|---|
| 6,583,691 B2 | 6/2003 | Takamine | |
| 6,768,397 B2 * | 7/2004 | Takamine | .................... 333/193 |
| 6,771,144 B2 | 8/2004 | Takamine | |
| 6,781,485 B2 * | 8/2004 | Takamine et al. | ............. 333/195 |
| 7,378,923 B2 | 5/2008 | Takamine | |

(Continued)

FOREIGN PATENT DOCUMENTS

| | | |
|---|---|---|
| JP | 2002009587 A | 1/2002 |
| JP | 2003283290 A | 10/2003 |

(Continued)

OTHER PUBLICATIONS

G. Kovacs et al.; "DMS Filter with Reduced Resistive Losses"; 2004 IEEE International Ultrasonics, Ferroelectrics, and Frequency Control Joint 50th Anniversary Conference, Aug. 23-27, 2004, 2004 IEEE Ultrasonics Symposium, vol. 1, pp. 294-297.*

(Continued)

*Primary Examiner* — Barbara Summons
(74) *Attorney, Agent, or Firm* — DLA Piper LLP (US)

(57) ABSTRACT

On a piezoelectric board, a SAW element has first to fifth IDT electrodes and reflector electrodes with first to fourth electrode-finger narrow-pitch portions N1-N4 being formed in the respective ones of adjoining portions of the respective first to fifth IDT electrodes. An unbalanced signal terminal and balanced signal terminals are connected to the SAW element. The electrode finger pitches of the first to fourth electrode-finger narrow-pitch portions N1-N4 are formed symmetrically with respect to the third, central IDT electrode in such a manner that the electrode finger pitch of the first electrode-finger narrow-pitch portion N1 is narrower than that of the second electrode-finger narrow-pitch portion N2, while the electrode finger pitch of the fourth electrode-finger narrow-pitch portion N4 is narrower than that of the third electrode-finger narrow-pitch portion N3.

10 Claims, 10 Drawing Sheets

U.S. PATENT DOCUMENTS

| | | | |
|---|---|---|---|
| 7,425,882 B2 * | 9/2008 | Takamine | 333/193 |
| 2002/0047759 A1 | 4/2002 | Takamine | |
| 2003/0137365 A1 | 7/2003 | Takamine | |
| 2003/0164745 A1 | 9/2003 | Takamine | |
| 2006/0208834 A1 * | 9/2006 | Takamine | 333/195 |
| 2007/0229194 A1 | 10/2007 | Takamine | |

FOREIGN PATENT DOCUMENTS

| | | | |
|---|---|---|---|
| JP | 2003324335 A | | 11/2003 |
| JP | 2005102328 A | | 4/2005 |
| JP | 2008-35092 | * | 2/2008 |
| WO | 2006068086 A1 | | 6/2006 |

OTHER PUBLICATIONS

J. Meltaus et al.; Low-Loss, Multimode 5-IDT SAW Filter; IEEE Transactions on Ultrasonics, Ferroelectrics, and Frequency Control, vol. 52, No. 6, Jun. 2005, pp. 1013-1019.*

Japanese language office action dated Mar. 6, 2012 and its English language translation issued in corresponding Japanese application 2009520412.

International search report for corresponding PCT application PCT/JP2008/060082 lists the references above, mailed Jul. 8, 2008.

* cited by examiner

SURFACE ACOUSTIC WAVE DEVICE AND COMMUNICATION DEVICE

CROSS-REFERENCE TO THE RELATED APPLICATIONS

This application is a national stage of international application No. PCT/JP2008/060082, filed on May 30, 2008, which also claims the benefit of priority under 35 USC 119 to Japanese Patent Application No. 2007-171015, filed on Jun. 28, 2007, the entire contents of which are incorporated herein by reference.

TECHNICAL FIELD

The present invention relates to a surface acoustic wave device, such as a surface acoustic wave filter, a surface acoustic wave resonator, or the like, used in, for example, a mobile phone or other mobile communication devices and to a communication device provided with the same.

Note that, below, "surface acoustic wave" may be abbreviated as "SAW".

BACKGROUND ART

Conventionally, as a frequency selection filter (below, also referred to as a "filter") used in an RF (radio frequency) stage of a mobile phone, car phone, or other mobile communication devices, a SAW filter has been widely used. In general, the characteristics required for a frequency selection filter include a broad pass band, low loss, high amount of attenuation, and others. In recent years, particularly for improvement of reception sensitivity and lowering of power consumption in mobile communication devices, there have been rising demands for reduction of loss in SAW filters. Further, in recent years, in mobile communication devices, for reduction of size, antennas have shifted from conventional whip antennas to built-in antennas using dielectric ceramics etc. For this reason, it has become difficult to sufficiently obtain the gain of an antenna. Demands for further reducing the insertion loss of SAW filters have been rising.

Further, in recent years, for reduction of size, lightening of weight, and lowering of costs of mobile communication devices etc., the number of parts used has been increasingly reduced. There have been demands for new functions to be added to SAW filters. One of the demands is for configuration as an unbalanced input-balanced output type or a balanced input-unbalanced output type (type having balance-unbalance conversion function). Here, a "balanced input" or a "balanced output" means that a signal is input or output as a potential difference between two signal lines, and the signals of the signal lines are equal in amplitude, but become inverse in phase. Contrary to this, "unbalanced input" or "unbalanced output" means that a signal is input or output as a potential of one line with respect to a ground potential.

Further, in recent years, along with the rapid changes in mobile communication system, the required specifications on the mobile communication system side have become stricter as well. Namely, a SAW filter with a broader band and having a shape more rectangular in comparison with a conventional filter and having a pass band characteristic such as excellent sharpness has been desired.

In order to realize such a broader band and lower loss of pass band, for example, a double mode SAW resonator filter provided with three IDT (inter digital transducer) electrodes on a piezoelectric substrate and utilizing a vertical first order mode and a vertical third order mode has been proposed. In a double mode SAW resonator filter, particularly, by providing electrode finger (electrode digit) narrow pitch portions at end portions of adjacent IDT electrodes, it is possible to reduce the radiation loss of a bulk wave between IDT electrodes to control the state of the resonance mode and thereby achieve broadening of the band and lowering of the loss (see, for example, Patent Citation 1).

Further, as another means for realizing the required broadening of the band, lowering of the loss, and a balance-unbalance conversion function, a double mode SAW resonator filter forming five IDT electrodes on a piezoelectric substrate has been proposed (see, for example, Patent Citation 2).

Patent Citation 1: Japanese Patent Publication (A) No. 2002-9587

Patent Citation 2: Japanese Patent Publication (A) No. 2005-102328

DISCLOSURE OF THE INVENTION

Problem to be Solved by the Invention

However, in general, a pass characteristic of a double mode SAW resonator filter is poor in sharpness at frequencies in the vicinity of the pass band. Further, in a conventional double mode SAW resonator filter forming five IDT electrodes on a piezoelectric substrate and realizing a broadening of the band, lowering of the loss, and unbalance-balance conversion function, there was a problem of deterioration in sharpness in the vicinity of the outside of the lower frequency side of the pass band.

Accordingly, preferably, there are provided a surface acoustic wave device realizing an unbalance-balance conversion function, improved in sharpness in the vicinity of the outside of the lower frequency side of the pass band, and able to function as a high quality balanced surface acoustic wave filter and a communication device using the same.

Means for Solving the Problem

A SAW device of the present invention comprises a piezoelectric substrate; a SAW element formed on the piezoelectric substrate and having first to fifth IDT electrodes aligned in a propagation direction of a SAW propagated on the piezoelectric substrate and provided with, along the propagation direction, a plurality of electrode fingers long in a direction perpendicular to the propagation direction, which first to fifth IDT electrodes have first to fourth narrow pitch portions of electrode fingers respectively formed at adjoining portions of these IDT electrodes, the first to fourth narrow pitch portions being formed symmetrically around the third IDT electrode located at the center, the pitch of the first narrow pitch portion being narrower than the pitch of the second narrow pitch portion, and the pitch of the fourth narrow pitch portion being narrower than the pitch of the third narrow pitch portion, and reflector electrodes arranged on both sides of the propagation direction of the first to fifth IDT electrodes and provided with a plurality of electrode fingers long in the direction perpendicular to the propagation direction; and an unbalanced signal terminal and balanced signal terminals connected to the SAW element.

Further, a communication device of the present invention is provided with at least one of a reception circuit and a transmission circuit having the above SAW device of the present invention.

Effects of the Invention

According to the SAW device of the present invention, in the low frequency region of the pass band, the electrode finger narrow pitch portions of the second and fourth IDT electrodes closer to the center among the five IDT electrodes are relatively wide, and the electrode finger narrow pitch portions of the first and fifth IDT electrodes on the reflector electrode sides are relatively narrow. Therefore, in the second and fourth IDT electrodes, at the position close to the center third IDT electrode, vibration of the SAW becomes strong. Along with this, vibration of the SAW at the third IDT electrode is weakened. Further, in the first and fifth IDT electrodes as well, vibration of the SAW becomes strong at the position close to the center third IDT electrode. Accordingly, by attenuation of vibration in the vicinity of the reflector electrodes, a reflection effect of the reflector electrodes becomes hard to obstruct. For this reason, the sharpness in the vicinity of the outside of the lower frequency side of the pass band can be improved.

Further, the first to fourth electrode finger narrow pitch portions having narrow electrode finger pitches are respectively formed at adjoining portions of the first to fifth IDT electrodes, an unbalanced input terminal or unbalanced output terminal and a balanced output terminal or balanced input terminal are connected to the SAW element, the electrode finger pitches of the first to fourth electrode finger narrow pitch portions are formed symmetrically with respect to the third IDT electrode located at the center, the electrode finger pitch of the second electrode finger narrow pitch portion is narrower than the electrode finger pitch of the first electrode finger narrow pitch portion, and the electrode finger pitch of the third electrode finger narrow pitch portion is narrower than the electrode finger pitch of the fourth electrode finger narrow pitch portion, whereby a propagation loss due to that the propagation length of the SAW becoming long is suppressed and the insertion loss can be suppressed.

Further, the first to fourth electrode finger narrow pitch portions having narrow electrode finger pitches are respectively formed at adjoining portions of the first to fifth IDT electrodes, therefore a balance type SAW filter can be realized in which conversion of a SAW to a bulk wave at the adjoining portions of the IDT electrodes can be effectively suppressed, insertion loss in the pass band can be improved, and the frequency characteristic is enhanced.

The communication device of the present invention is provided with at least one of a reception circuit and a transmission circuit which has any of the SAW devices of the present invention described above, whereby a device able to realize a frequency characteristic satisfying the severe conventional demands for insertion loss and sharpness is obtained, and a communication device having a reduced power consumption and much better sensitivity can be realized.

BRIEF DESCRIPTION OF DRAWINGS

FIG. 1 Views showing an example of an embodiment of a SAW device of the present invention, in which

FIG. 2 Views showing another example of an embodiment of a SAW device of the present invention, in which

FIG. 5 Views showing a SAW device of an embodiment of the present invention and a SAW device of a comparative example, in which

EXPLANATION OF REFERENCE

Figure 1A:
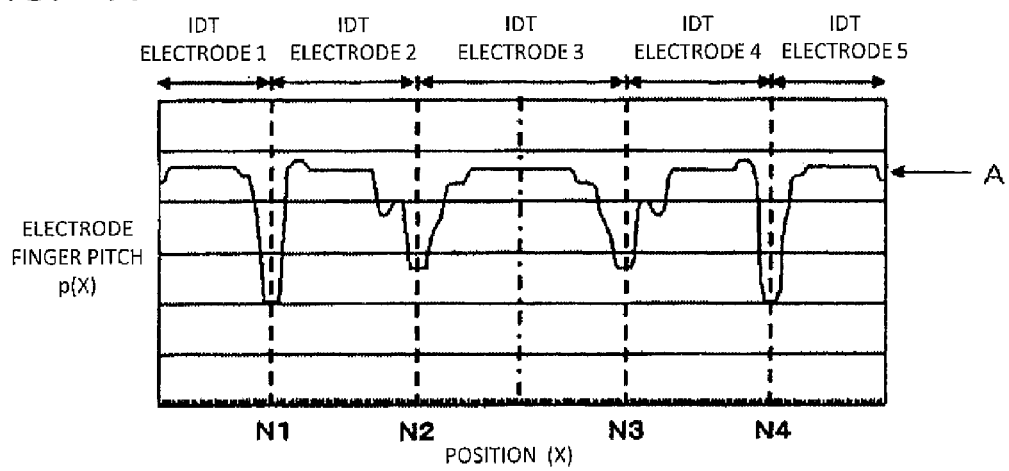
FIG. 1A is a graph showing the relationships between positions of electrodes and electrode finger pitches in adjoining IDT electrodes and FIG. 1B is a plan view of a SAW device showing patterns of electrodes.

11: SAW element
12, 13, 14: SAW resonators
1 to 5: first to fifth IDT electrodes
6, 7: reflector electrodes
8: unbalanced signal terminal
9, 10: balanced signal terminals
100: piezoelectric substrate

BEST MODE FOR CARRYING OUT THE INVENTION

Below, an embodiment of a SAW device of the present invention will be explained in detail with reference to the drawings. Further, the SAW device of the present invention will be explained taking as an example a resonator type SAW filter with a simple structure. Note that, in the drawings explained below, the same constitutions will be assigned the same notations. Further, the sizes of the electrodes, distance between electrodes, number and interval of electrode fingers, etc. will be diagrammatically shown for the explanation.

Figure 1B:
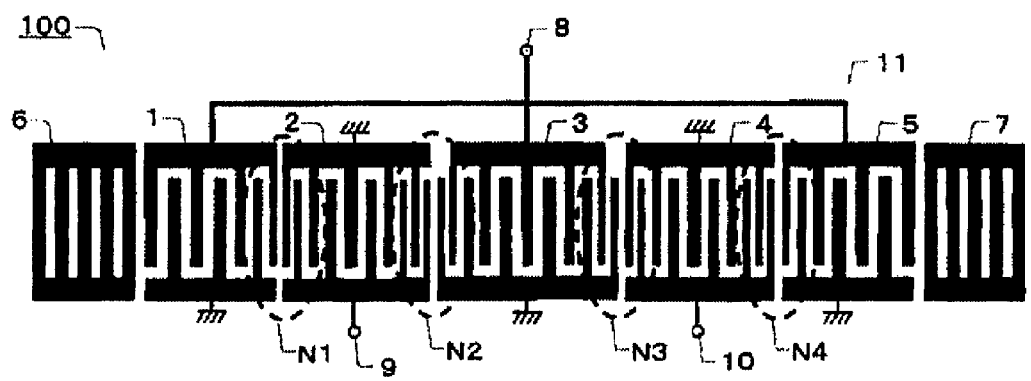

FIG. 1B shows a plan view of an example of an embodiment of an electrode structure of a SAW device of the present invention. Further, FIG. 1A shows a graph of change in the electrode finger pitch of the IDT electrodes of the SAW device of FIG. 1B.

As shown in FIGS. 1A and 1B, in the SAW device of the present invention, a piezoelectric substrate 100 is formed with a SAW element 11. The SAW element 11 has first to fifth IDT electrodes 1 to 5 provided with, along the propagation direction of the SAW propagating on the piezoelectric substrate 100, a plurality of electrode fingers long in a direction perpendicular to the propagation direction and reflector electrodes 6 and 7 arranged on the two sides of the first to fifth IDT electrodes 1 to 5 and provided with a plurality of electrode fingers long in the direction perpendicular to the propagation direction, in which first to fourth electrode finger narrow pitch portions N1 to N4 having narrow electrode finger pitches are respectively formed at adjoining portions of the first to fifth IDT electrodes 1 to 5. Further, an unbalanced signal terminal 8 and balanced signal terminals 9 and 10 are connected to the SAW element 11, electrode finger pitches of the first to fourth electrode finger narrow pitch portions N1 to N4 are formed symmetrically around the third IDT electrode 3 located at the center, the electrode finger pitch of the first electrode finger narrow pitch portion N1 is narrower than the electrode finger pitch of the second electrode finger narrow pitch portion N2, and the electrode finger pitch of the fourth electrode finger narrow pitch portion N4 becomes narrower than the electrode finger pitch of the third electrode finger narrow pitch portion N3. Note that, the unbalanced signal terminal 8 is an unbalanced input terminal or unbalanced output terminal. Further, the balanced signal terminals 9 and 10 are balanced output terminals when the unbalanced signal terminal 8 is an unbalanced input terminal and are balanced input terminals when the unbalanced signal terminal 8 is an unbalanced output terminal.

By this constitution, in the low frequency region of the pass band, among the five IDT electrodes, the electrode finger narrow pitch portions N2 and N3 of the second and fourth IDT electrodes 2 and 4 closer to the center are relatively wide, and the electrode finger narrow pitch portions N1 and N4 of the first and fifth IDT electrodes 1 and 5 on the reflector electrode 6 and 7 side are relatively narrow. Therefore, in the second and fourth IDT electrodes 2 and 4, vibration of the SAW becomes strong at the position close to the center third IDT electrode 3. Along with this, in the third IDT electrode 3, vibration of the SAW is weakened. Further, in the first and fifth IDT electrodes 1 and 5 as well, vibration of the SAW becomes stronger at the position close to the center third IDT electrode 3. Accordingly, by attenuation of vibration of the SAW in the vicinity of the reflector electrodes 6 and 7, the reflection effect of the reflector electrodes 6 and 7 becomes less likely to be blocked. For this reason, sharpness in the vicinity of the outside of the lower frequency side of the pass band can be improved.

Note that, in the present invention, the "electrode finger pitch" is represented by a distance between center lines parallel to the longitudinal direction of adjoining electrode fingers. Further, an "electrode finger narrow pitch portion" means a portion in which the electrode finger pitch becomes 99% or less of the electrode finger pitch in an electrode finger wide pitch portion in which the electrode finger pitch is constant and wide. Note that, the electrode finger pitches located on a line indicated by an arrow A in FIG. 1A are the electrode finger wide pitch portions. When the electrode finger narrow pitch portion is a first region, and the electrode finger wide pitch portion is a second region, each IDT electrode has a first region in which the electrode finger pitch is narrow, and a second region in which the electrode finger pitch is wide.

For example, in the second and fourth IDT electrodes 2 and 4, the electrode finger pitch of the electrode finger wide pitch portions in which the electrode finger pitch is constant and wide is about 1.07 μm, the electrode finger pitch of the portion having the narrowest electrode finger pitch in the electrode finger narrow pitch portions N2 and N3 is about 0.97 to 1.03 μm, and a average electrode finger pitch of the electrode finger narrow pitch portions N2 and N3 is about 1.00 to 1.03 μm. Further, a width of the electrode finger narrow pitch portions N2 and N3 in the propagation direction of SAW is about 12 μm.

In the first and fifth IDT electrodes 1 and 5, the electrode finger pitch of the electrode finger wide pitch portions in which the electrode finger pitch is constant and wide is about 1.09 μm, the electrode finger pitch of the portion having the narrowest electrode finger pitch in the electrode finger narrow pitch portions N1 and N4 is about 0.94 to 0.99 μm, and a average electrode finger pitch of the electrode finger narrow pitch portions N1 and N4 is about 0.96 to 0.99 μm. Further, the width of the electrode finger narrow pitch portions N1 and N4 in the propagation direction of SAW is about 6 μm.

Accordingly, preferably the average electrode finger pitch of the electrode finger narrow pitch portions N2 and N3 is broader than the average electrode finger pitch of the electrode finger narrow pitch portions N1 and N4 by about 1 to 7% of the average electrode finger pitch of the electrode finger narrow pitch portions N1 and N4. By the electrode finger narrow pitch portions N1 to N4 satisfying such relationships, attenuation in the vicinity of the outside of the lower frequency side of the pass band can be made sharp and a surface acoustic wave device having a small insertion loss can be achieved.

Further, as shown in FIG. 1, in the SAW device of the present invention, the unbalanced signal terminal 8 is connected in parallel to the first, third, and fifth IDT electrodes 1, 3, and 5, and the balanced signal terminals 9 and 10 are respectively connected to the second and fourth IDT electrodes 2 and 4.

Due to this constitution, in the second and fourth IDT electrodes 2 and 4, vibration of the SAW is strengthened at a position close to third IDT electrode 3 at the center and vibration of the SAW is weakened at the third IDT electrode 3. Also, in the first and fifth IDT electrodes 1 and 5, vibration of the SAW is strengthened at a position close to the center third IDT electrode 3. Accordingly, by attenuation of vibration of the SAW in the vicinity of the reflector electrodes 6 and 7, the reflection effect of the reflector electrodes 6 and 7 becomes less likely to be blocked, so the sharpness in the vicinity of the outside of the lower frequency side of the pass band can be improved.

Figure 2A:
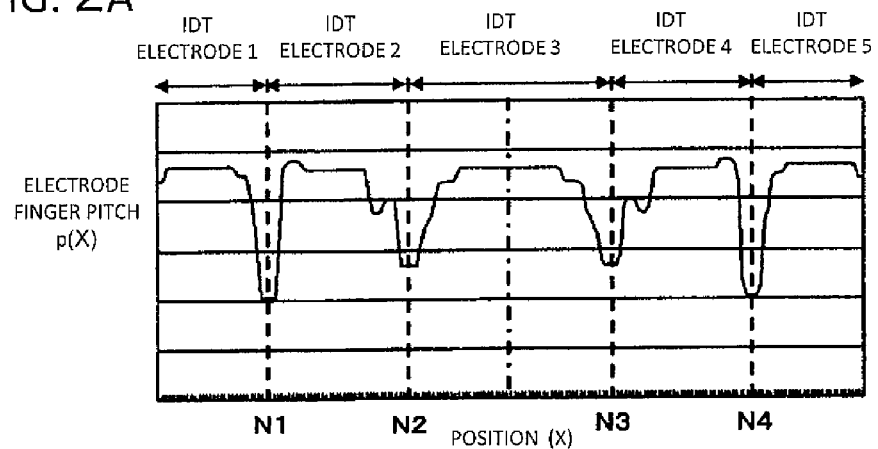
FIG. 2A is a graph showing relationships between positions of electrodes and electrode finger pitches in adjoining IDT electrodes and FIG. 2B is a plan view of a SAW device showing patterns of electrodes.
Figure 2B:
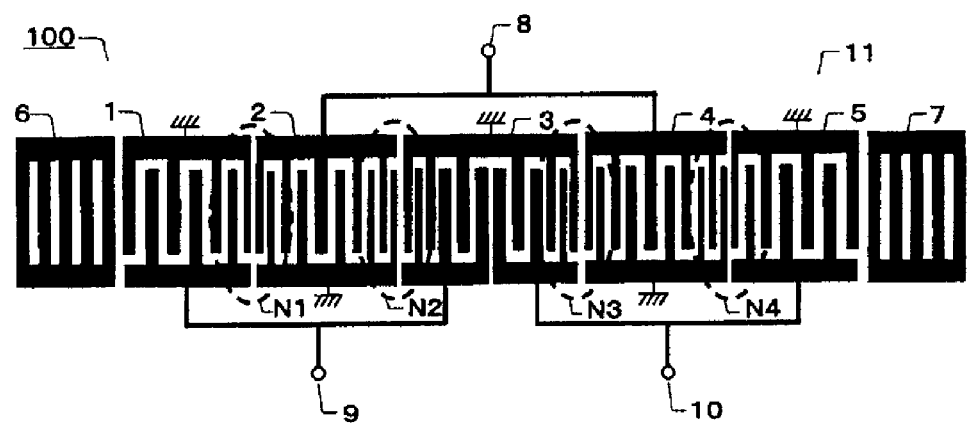

FIG. 2B shows a plan view of an example of another embodiment of an electrode structure of a SAW device of the present invention. Further, FIG. 2A shows a graph of a change in the electrode finger pitch of the IDT electrode of the SAW device shown in FIG. 2B.

In the SAW device shown in FIG. 2, a SAW element 11 is formed having first to fifth IDT electrodes 1 to 5 provided with, along the propagation direction of the SAW propagating on the piezoelectric substrate 100, a plurality of electrode fingers long in a direction perpendicular to the propagation direction and reflector electrodes 6 and 7 arranged on both sides of the first to fifth IDT electrodes 1 to 5 and provided with a plurality of electrode fingers long in the direction perpendicular to the propagation direction, in which first to fourth electrode finger narrow pitch portions N1 to N4 having narrow electrode finger pitches are respectively formed in adjoining portions of the first to fifth IDT electrodes 1 to 5. Further, an unbalanced signal terminal 8 and balanced signal terminals 9 and 10 are connected to the SAW element 11, electrode finger pitches of the first to fourth electrode finger narrow pitch portions N1 to N4 are formed symmetrically around the third IDT electrode 3 located at the center, the electrode finger pitch of the first electrode finger narrow pitch portion N1 is narrower than the electrode finger pitch of the second electrode finger narrow pitch portion N2, and the electrode finger pitch of the fourth electrode finger narrow pitch portion N4 becomes narrower than the electrode finger pitch of the third electrode finger narrow pitch portion N3. Further, the unbalanced signal terminal 8 is connected in parallel to the second and fourth IDT electrodes 2 and 4, one comb-shaped electrode (interdigital electrode) of the third IDT electrode 3 is divided into two, and one of the divided portions and first IDT electrode 1 and the other one of the divided portions and fifth IDT electrode 5 are respectively connected to the balanced signal terminals 9 and 10.

Due to this constitution, in the second and fourth IDT electrodes 2 and 4, vibration of the SAW is strengthened at the position close to the third IDT electrode 3 at the center, and vibration of the SAW is weakened at the third IDT electrode 3. Also in the first and fifth IDT electrodes 1 and 5, vibration of the SAW is strengthened at the position close to the center third IDT electrode 3. Accordingly, by attenuation of vibration of the SAW in the vicinity of the reflector electrodes 6 and 7, the reflection effect of the reflector electrodes 6 and 7 becomes less likely to be blocked, so the sharpness in the vicinity of the outside of the lower frequency side of the pass band can be improved.

Figure 3:
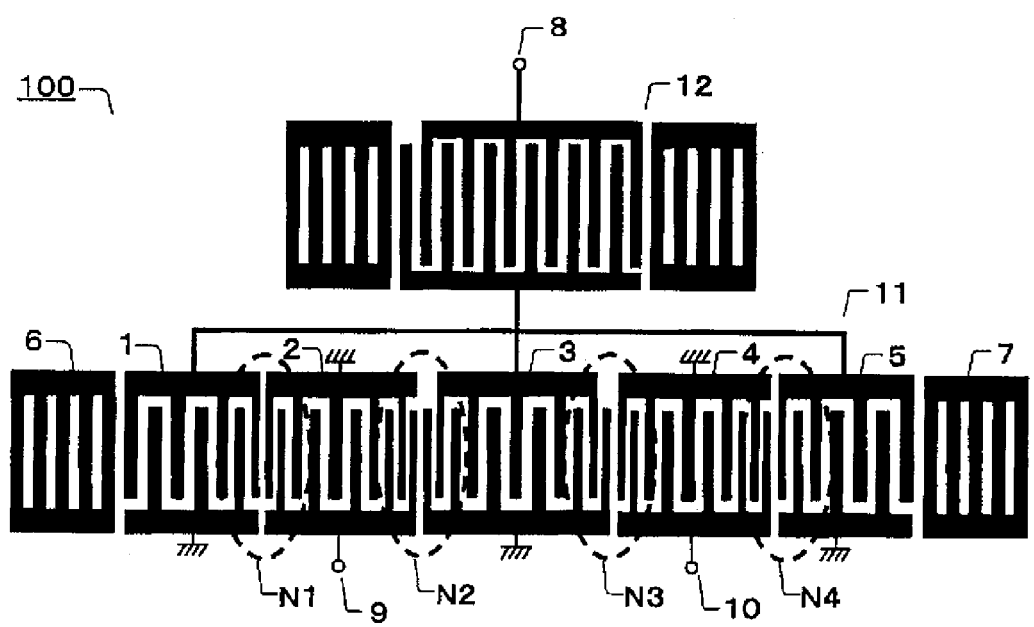
FIG. 3 A plan view showing another example of an embodiment of a SAW device of the present invention.

FIG. 3 shows a plan view of another example of an embodiment of a SAW device of the present invention. The SAW device shown in FIG. 3 is formed by connecting a SAW resonator 12 between the SAW element 11 and the unbalanced signal terminal 8. Note that, the SAW element 11 of the SAW device shown in FIG. 3 is the same as the SAW device 11 of FIG. 1B.

Due to this constitution, an attenuation pole can be formed on the outside of the lower frequency side of a pass band, therefore an amount of attenuation in the vicinity of the outside of the lower frequency side of the pass band can be enhanced and further the sharpness in the vicinity of the outside of the lower frequency side of the pass band can be improved.

As the constitution of the SAW resonator 12 exhibiting such effects, for example, the electrode finger pitch of the IDT electrode is about 1.06 μm, the number of pairs of the electrode fingers is about 160, an electrode finger intersection width is about 55 μm, the electrode finger pitch of the reflector electrodes is about 1.065 μm, and the number of pairs of the reflector electrodes is about 10.

Figure 4:
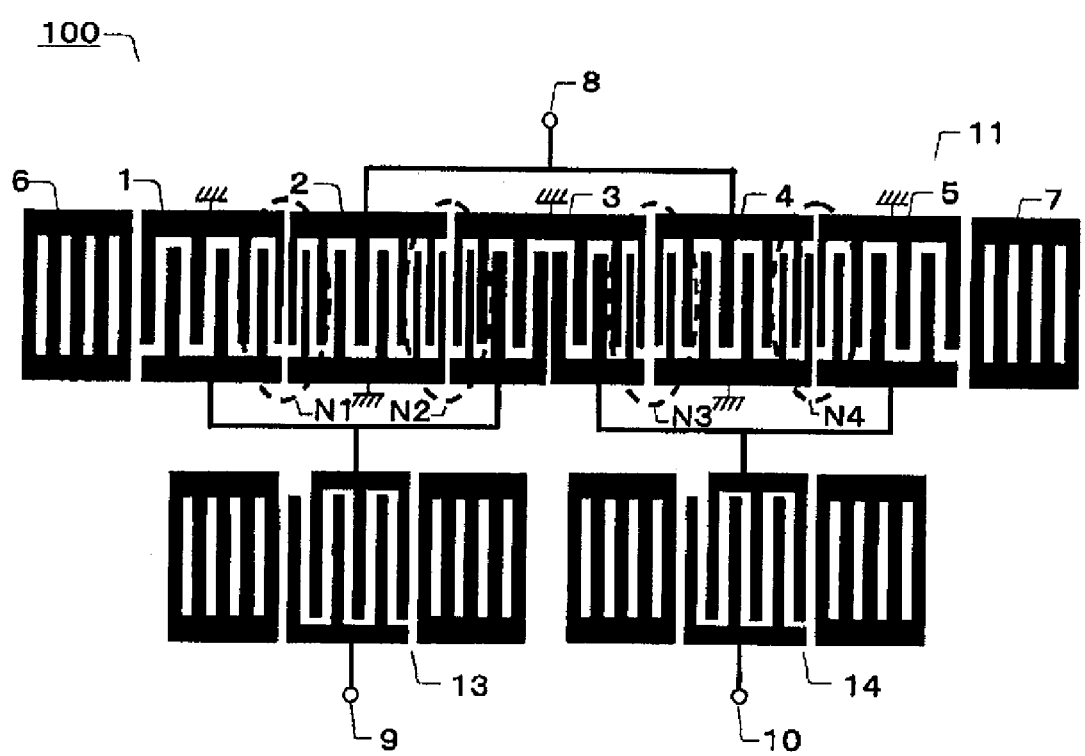
FIG. 4 A plan view showing another example of an embodiment of a SAW device of the present invention.

FIG. 4 shows a plan view of another example of an embodiment of a SAW device of the present invention. The SAW device shown in FIG. 4 is formed by connecting SAW resonators 13 and 14 between the SAW element 11 and the balanced signal terminals 9 and 10, respectively. Namely, the SAW resonator 13 is connected between the SAW element 11 and the balanced signal terminal 9, and the SAW resonator 14 is connected between the SAW element 11 and the balanced signal terminal 10. Note that, the SAW element 11 of the SAW device shown in FIG. 4 is the same as the SAW element 11 of FIG. 2B.

Due to this constitution, an attenuation pole can be formed on the outside of the lower frequency side of the pass band, therefore the amount of attenuation in the vicinity of the outside of the lower frequency side of the pass band can be enhanced and further the sharpness in the vicinity of the outside of the lower frequency side of the pass band can be improved.

As the constitution of the SAW resonators 13 and 14 exhibiting such effects, for example, the electrode finger pitch of the IDT electrode is about 1.06 μm, the number of pairs of electrode fingers is about 80, the electrode finger intersection width is about 55 μm, the electrode finger pitch of the reflector electrodes is about 1.065 μm, and the number of pairs of electrode fingers of the reflector electrodes is about 10.

Note that, the number of electrode fingers of the IDT electrodes 1 to 5, reflector electrodes 6 and 7, SAW element 11, and SAW resonators 12 to 14 reach several to several hundreds. Therefore, for simplification, the shapes of those are simplified and shown in the drawings.

As the piezoelectric substrates 100 of the SAW devices shown in FIG. 1 to FIG. 4, preferably use is made of a 36°±3° Y-cut X-propagation lithium tantalite single crystal, a 42°±3° Y-cut X-propagation lithium tantalite single crystal, a 64°±3° Y-cut X-propagation lithium niobate single crystal, a 41°±3° Y-cut X-propagation lithium niobate single crystal, a 45°±3° X-cut Z-propagated lithium tetraborate single crystal, and so on. These piezoelectric substrates have large electromechanical coupling coefficients and small frequency temperature coefficients, therefore SAW devices excellent in electric characteristics can be achieved. Further, among these pyroelectric piezoelectric single crystals, a piezoelectric substrate 100 having pyroelectricity remarkably reduced due to oxygen defects or solid solution of Fe or the like is good in the reliability of the device. The thickness of the piezoelectric substrate 100 is preferably about 0.1 to 0.5 mm. By setting within this range, a SAW device in a small size and excellent shock resistance can be achieved.

Further, the IDT electrodes and reflector electrodes are comprised of Al or an Al alloy (Al—Cu-based or Al—Ti-based) and are formed by the vapor deposition method, sputtering method, CVD method, or other thin film formation method. An electrode thickness set to about 0.1 to 0.5 μm is preferred for obtaining the desired characteristics as the SAW filter.

Further, in the electrodes of the SAW device and the propagation portion of the SAW on the piezoelectric substrate 100 according to the present invention, $SiO_2$, $SiNx$, $Si$, and $Al_2O_3$ may be formed as protective membranes to prevent conduction due to conductive foreign substances and to improve the power resistance.

Further, the SAW device of the present invention can be applied to a mobile phone or other communication device. Namely, the phone or the like is provided with at least one of a reception circuit or transmission circuit, and the device is used as a band pass filter included in each of these circuits. For example, the device can be applied to a communication device provided with a transmission circuit in which a transmission signal output from a transmission circuit is placed on a carrier frequency by a mixer, an unrequired signal is attenuated by a band pass filter, then the transmission signal is amplified by a power amplifier and transmitted from an antenna through a duplexer or to a communication device provided with a reception circuit in which a reception signal is received by an antenna, the reception signal passed through a duplexer is amplified by a low noise amplifier, an unrequired signal is attenuated by the band pass filter, then the signal is demultiplexed from the carrier frequency by the mixer and the result is transmitted to the reception circuit extracting this signal.

Figure 7:
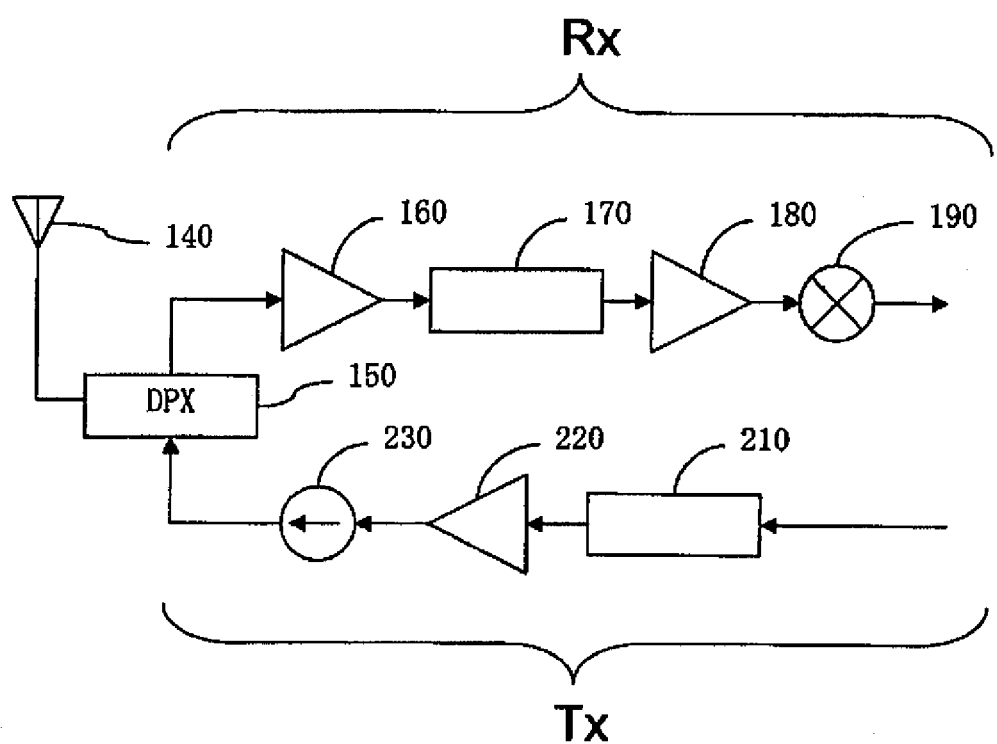
FIG. 7 A block circuit diagram of an example of an embodiment of a communication device of the present invention.

FIG. 7 is a block circuit diagram showing an example of an embodiment of a communication device of the present invention. In FIG. 7, a transmission circuit Tx and a reception circuit Rx are connected to an antenna 140 via a branching filter 150. The transmitted high frequency signal is stripped of its unrequired signal by a filter 210, amplified by a power amplifier 220, then passes through an isolator 230 and the branching filter 150 and is emitted from the antenna 140. Further, the high frequency signal received at the antenna 140 passes through the branching filter 150, is amplified by a low noise amplifier 160, stripped of its unrequired signal by a filter 170, then amplified again by an amplifier 180 and converted to a low frequency signal.

In the communication device shown in FIG. 7, if the branching filter 150 is constituted by using the SAW device of the present invention, the insertion loss and sharpness of the branching filter 150 are improved, therefore the device becomes an excellent communication device in which the power consumption is reduced and the sensitivity is especially good.

Embodiment 1

An embodiment of a SAW device of the present invention will be explained below.

An embodiment of preparing a SAW device having electrode finger pitches indicated by a solid line in FIG. 5A will be explained specifically. The SAW device of the present embodiment has, as shown in FIG. 5B, a constitution in which a SAW resonator 12 is connected between a SAW element 11 and an unbalanced signal terminal 8.

On the piezoelectric substrate (mother board for providing many units) 100 composed of a 38.7° Y-cut and X-direction propagation LiTaO$_3$ single crystal, fine electrode patterns for various types of electrodes composed of Al (99 vol %)—Cu (1 vol %) alloy were formed.

Further, the electrodes were patterned by a photolithography method using a sputtering apparatus, a reduced projection exposure apparatus (stepper), and an RIE (reactive ion etching) apparatus.

First, the piezoelectric substrate 100 was ultrasonically cleaned by acetone, IPA (isopropyl alcohol), or the like to remove organic ingredients. Next, the piezoelectric substrate 100 was sufficiently dried by a clean oven, then a metal layer for forming the electrodes as formed by film formation. For the formation of the metal layer, a sputtering apparatus was used. Al (99 vol %)—Cu (1 vol %) alloy was used as the material of the metal layer. The thickness of the metal layer at this time was set to about 0.18 μm.

Next, a photo-resist layer was spin-coated on the metal layer to a thickness of about 0.5 μm, patterned into a desired shape by a reduced projection exposure apparatus (stepper), then stripped of the unrequired portions of the photo-resist layer by an alkali developer by a developer apparatus to expose the desired pattern. After that, the metal layer was etched by an RIE apparatus, the patterning was ended, and patterns of electrodes constituting the SAW device were obtained.

After this, a protective membrane was formed on a predetermined region of the electrode. Namely, a CVD (chemical vapor deposition) apparatus was used to form patterns of electrodes and the SiO$_2$ layer on the piezoelectric substrate 100 to a thickness of about 0.02 μm.

After that, the photolithography method was used for patterning and an RIE apparatus or the like was used for etching a flip-chip window opening. After that, the flip-chip window opening is formed with a pad electrode comprised of a Cr layer, Ni layer, and Au layer using the sputtering apparatus. The thickness of the pad electrode at this time was controlled to about 1.0 μm. After that a printing method and a reflow furnace were used to form solder bumps for flip chip mounting of the SAW device on an external circuit board or the like.

Next, the piezoelectric substrate 100 was diced along separation lines to split it into the individual SAW devices (chips). After that, each chip was placed in a package with the surface of formation of the electrode pads facing down and bonded by a flip chip mounting apparatus. After that, each package was baked in an N$_2$ gas atmosphere to complete a packaged SAW device. A package with a 2.5×2.0 mm square laminate structure formed by stacking ceramic layers in multiple layers was used.

In the prepared SAW device, in the second and fourth IDT electrodes 2 and 4, the electrode finger pitch of the electrode finger wide pitch portions in which the electrode finger pitch is constant and wide is 1.07 μm, and the electrode finger pitch of the portion with the narrowest electrode finger pitch in the electrode finger narrow pitch portions N2 and N3 is 0.96 μm. Further, a average electrode finger pitch of the electrode finger narrow pitch portions N2 and N3 was controlled to 1.02 μm. Further, the width in the propagation direction of SAW of the electrode finger narrow pitch portions N2 and N3 was controlled to 18.4 μm.

In the first and fifth IDT electrodes 1 and 5, the electrode finger pitch of the electrode finger wide pitch portions in which the electrode finger pitch is constant and wide was 1.09 μm, and the electrode finger pitch of the portion with the narrowest electrode finger pitch in the electrode finger narrow pitch portions N1 and N4 was 0.96 μm. Further, a average electrode finger pitch of the electrode finger narrow pitch portions N1 and N4 was controlled to 0.989 μm. Further, the width in the propagation direction of the SAW of the electrode finger narrow pitch portions N1 and N4 was controlled to 7.91 μm.

Accordingly, the average electrode finger pitch of the electrode finger narrow pitch portions N2 and N3 was made broader than the average electrode finger pitch of the electrode finger narrow pitch portions N1 and N4 by 3.5% of the average electrode finger pitch of the electrode finger narrow pitch portions N1 and N4.

Further, as the constitution of the SAW resonator 12, for example, the electrode finger pitch of the IDT electrodes was 1.06 μm, the number of pairs of the electrode fingers was about 160, the electrode finger intersection width was about 55, the electrode finger pitch of the reflector electrodes was 1.065 μm, and the number of pairs of the electrode fingers of the reflector electrodes was 10.

Figure 5A:
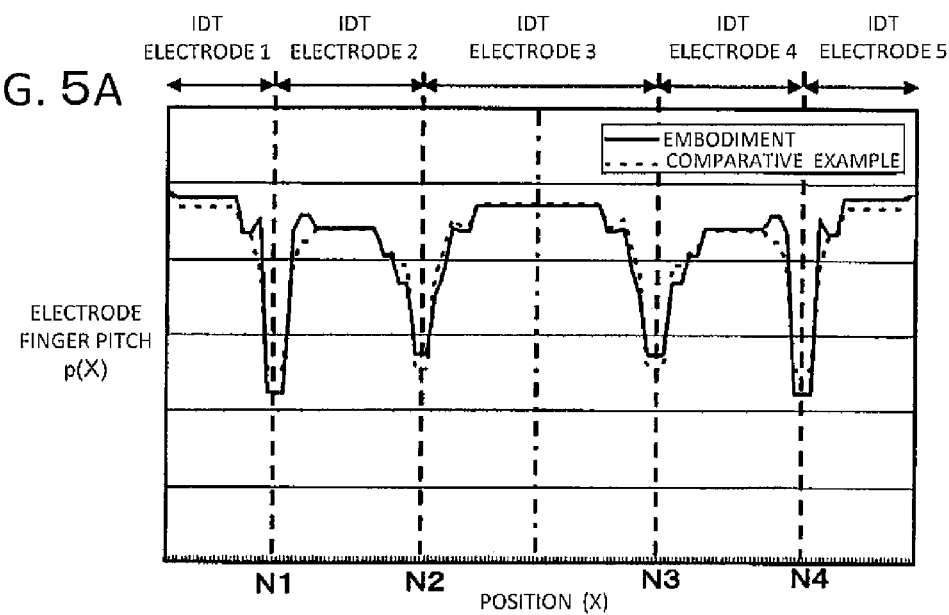
FIG. 5A is a graph showing relationships between positions of electrodes and electrode finger pitches in adjoining IDT electrodes (solid line indicates a SAW device of an embodiment, and broken line indicates a SAW device of the comparative example)
Figure 5B:
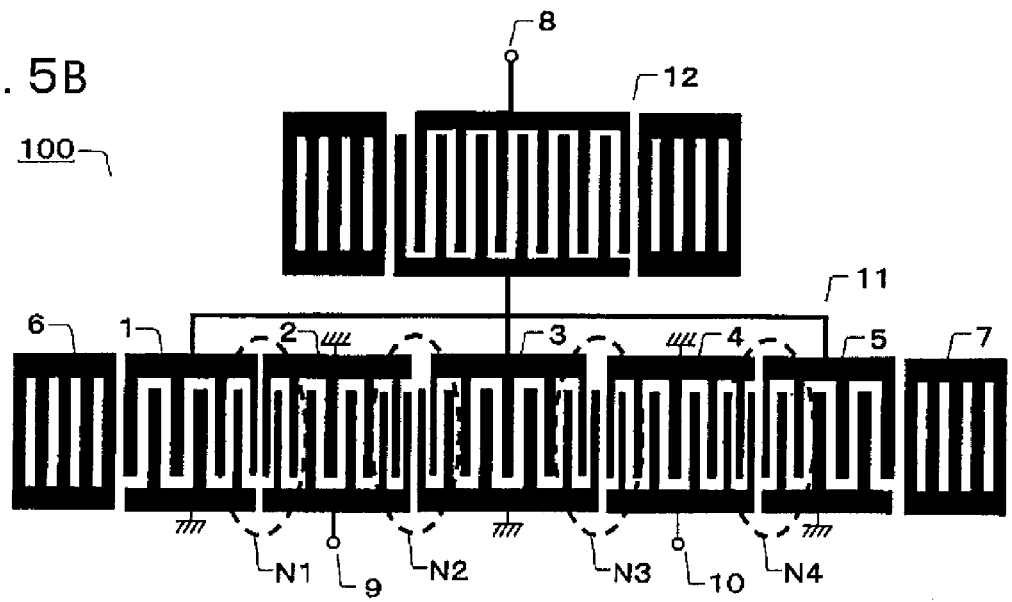
FIG. 5B is a plan view of a SAW device showing patterns of electrodes.

Further, as a sample of a comparative example, a SAW device having electrode finger pitches indicated by a broken line in FIG. 5A was prepared.

Namely, in the SAW device of the comparative example, the electrode finger pitch of the second electrode finger narrow pitch portion N2 and the electrode finger pitch of the first electrode finger narrow pitch portion N1 were made the same, and the electrode finger pitch of the third electrode finger narrow pitch portion N3 and the electrode finger pitch of the fourth electrode finger narrow pitch portion N4 were made the same. The rest of the constitution was made the same as the constitution of the SAW device of the embodiment described above. Further, the SAW device of the comparative example was prepared by the same steps as those of the above embodiment. In the SAW device of the comparative example as well, the SAW resonator 12 was connected between the SAW element 11 and the unbalanced signal terminal 8.

Next, the SAW devices of the present embodiment and comparative example were measured for their characteristics. The measurement was carried out by inputting a signal of 0 dBm under conditions of a frequency of 1640 to 2140 MHz at 801 measurement points. The number of samples was 30 for each. The measurement apparatus was a multiport network analyzer ("E5071A" made by Agilent Technologies JAPAN, LTD.).

Figure 6:
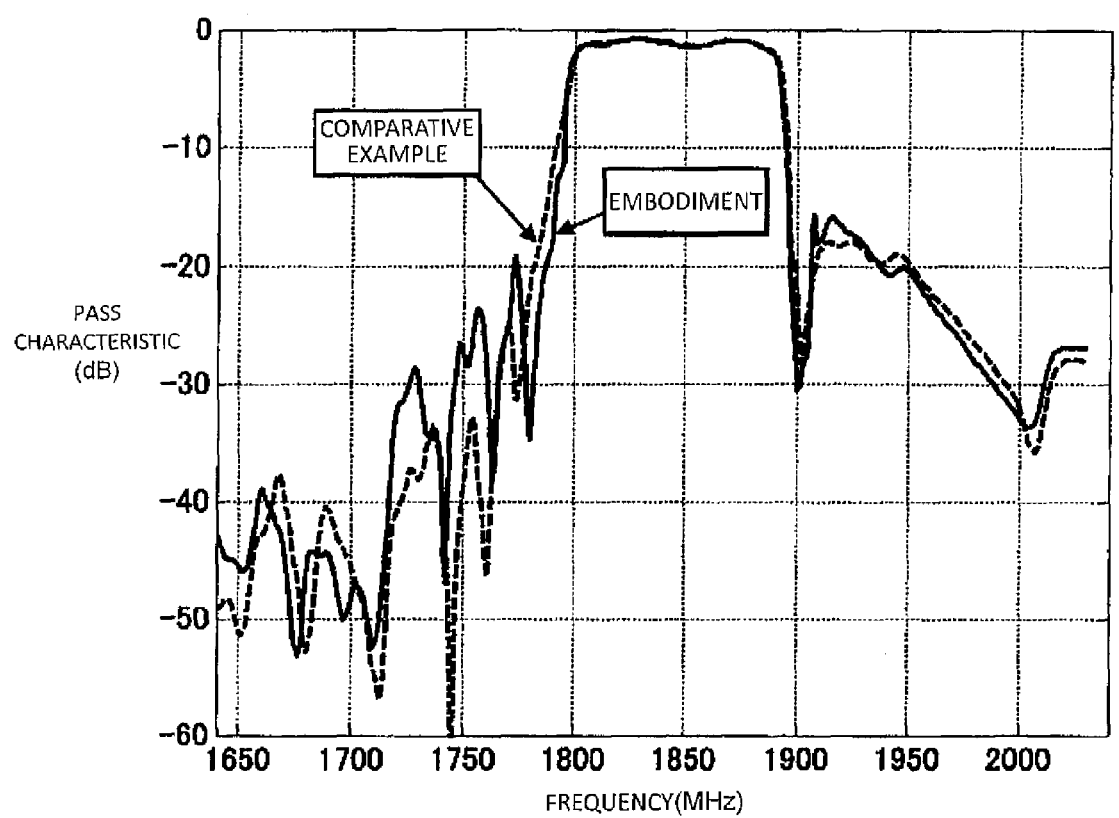
FIG. 6 A graph showing frequency characteristics of insertion loss in a pass band and in the vicinity thereof for a SAW device of an embodiment of the present invention and a SAW device of a comparative example.

A graph of the frequency characteristics in the vicinity of the pass band is shown in FIG. 6. FIG. 6 is a graph showing a frequency dependency of the insertion loss representing the transmission characteristic of the SAW device as a SAW filter. The filter characteristic of the present embodiment was very good. Namely, in comparison with the SAW filter of the comparative example indicated by a broken line in FIG. 6, as indicated by a solid line in FIG. 6, a good filter characteristic was obtained where the sharpness in the vicinity (about 1780 to 1790 MHz) of the outside of the lower frequency side of the pass band of the SAW filter of the present embodiment was improved.

In this way, in the present embodiment, a SAW device having sharpness in the vicinity of the outside of the lower frequency side of the pass band improved could be realized.

The frequency characteristics in the vicinity of the pass band will be shown below for other embodiments of the SAW device of the present invention. Note that, the following other embodiments satisfy the same conditions as those of the above-explained embodiment except for the specially described conditions. Further, the frequency characteristics of the following embodiments were obtained by simulation.

Figure 8:
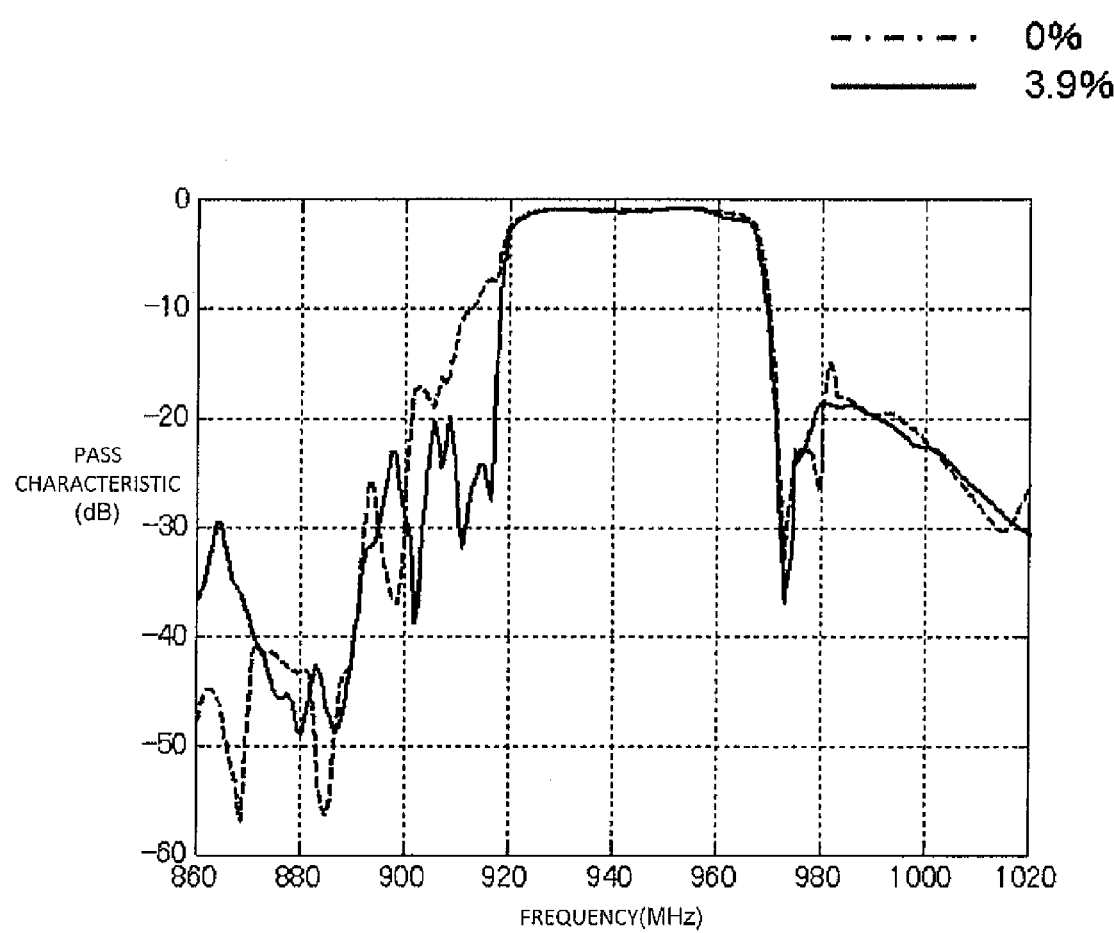
FIG. 8 A graph showing a frequency characteristic of an embodiment with a different pass band from that of FIG. 6.

FIG. 8 shows a frequency characteristic of an embodiment using a frequency band different from that of FIG. 6 as the pass band. In FIG. 8, the embodiment is indicated by a solid line, and the comparative example is indicated by a dotted line. In the embodiment of FIG. 8, the average electrode finger pitch of the electrode finger narrow pitch portions N2 and N3 is broader than the average electrode finger pitch of the electrode finger narrow pitch portions N1 and N4 by 3.9% of the average electrode finger pitch of the electrode finger narrow pitch portions N1 and N4.

In FIG. 8, in both of the embodiment and comparative example, about 917 to 973 MHz is used as the pass band. In this pass band as well, in comparison with the comparative example, in the embodiment, the sharpness in the vicinity (about 900 to 917 MHz) of the outside of the lower frequency side of the pass band is improved.

Figure 9A:
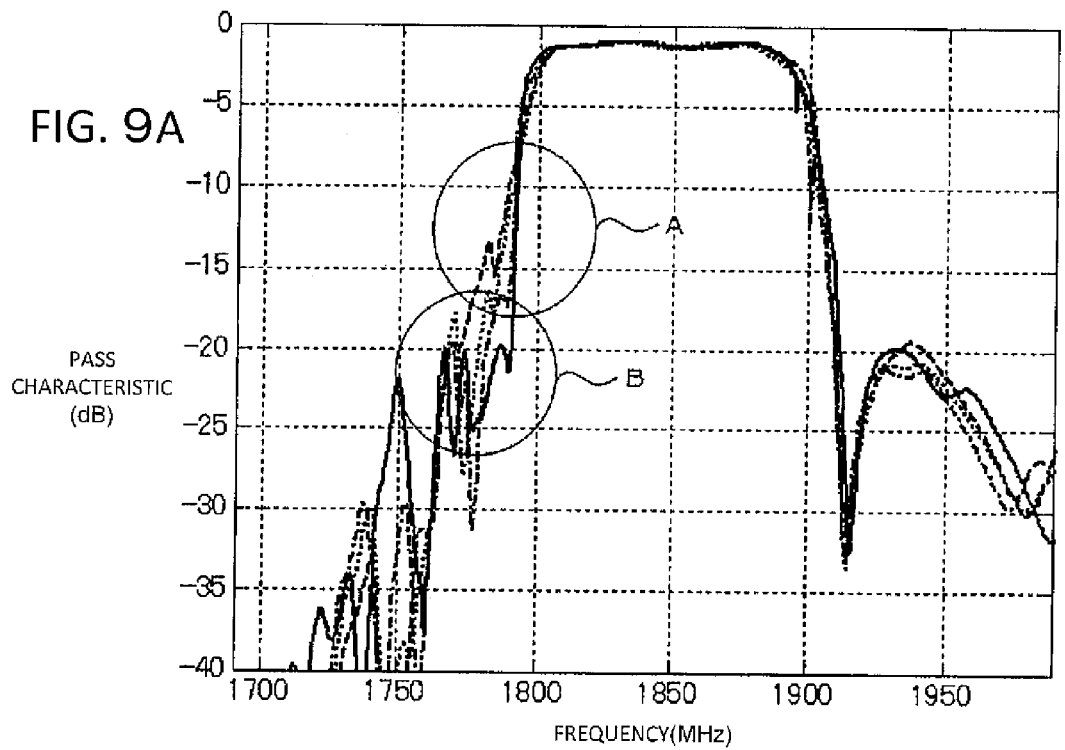
FIG. 9 A graph showing a frequency characteristic of an embodiment with different electrode finger pitches from those of FIG. 5.
Figure 9B:
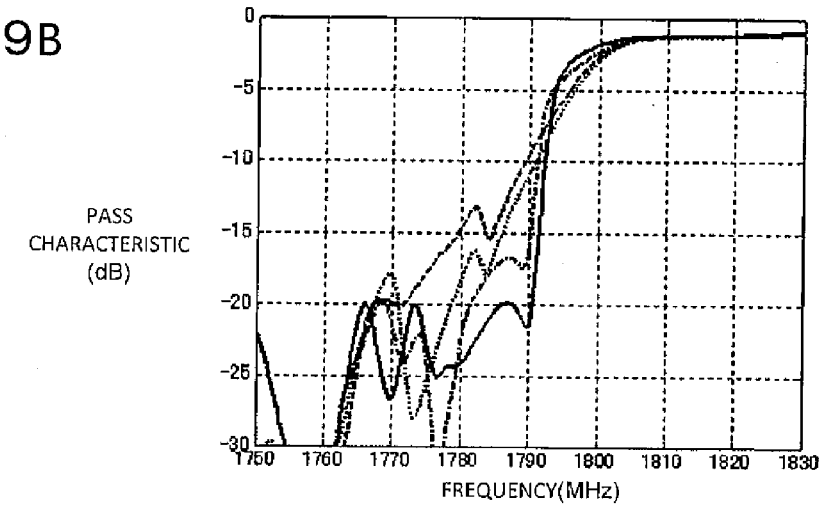

FIG. 9 shows the frequency characteristics of embodiments in which a ratio of broadness of the average electrode finger pitch of the electrode finger narrow pitch portions N2 and N3 with respect to the average electrode finger pitch of the electrode finger narrow pitch portions N1 and N4 is different from that in FIG. 5. Note that, FIG. 9B is obtained by enlarging the regions A and B shown in FIG. 9A.

Specifically, FIG. 9 shows the frequency characteristics of embodiments in which the average electrode finger pitch of the electrode finger narrow pitch portions N2 and N3 is broader than the average electrode finger pitch of the electrode finger narrow pitch portions N1 and N4 by 0.8%, 1.4%, and 3% of the average electrode finger pitch of the electrode finger narrow pitch portions N1 and N4 and the comparative example.

When viewing the vicinity of the outside of the lower frequency side of the pass band (range indicated by regions A and B, about 1770 to 1890 MHz), in all of the three embodiments shown in FIG. 9, in comparison with the comparative example, the sharpness of the pass band is improved. Further, the improvement of sharpness becomes more conspicuous in the order of 0.8%, 1.4%, and 3%.

At a position further closer to the pass band (region A), the improvement of sharpness in a case where the pitch is changed from 0.8% to 1.4% is more conspicuous than the improvement of sharpness in a case where the pitch is changed from 0% to 0.8%. On the other hand, it is not much different from the improvement of the sharpness in a case where the pitch is changed from 1.4% to 3%. Namely, in the region A, when the pitch exceeds about 1.0%, the improvement of sharpness becomes conspicuous.

Figure 10A:
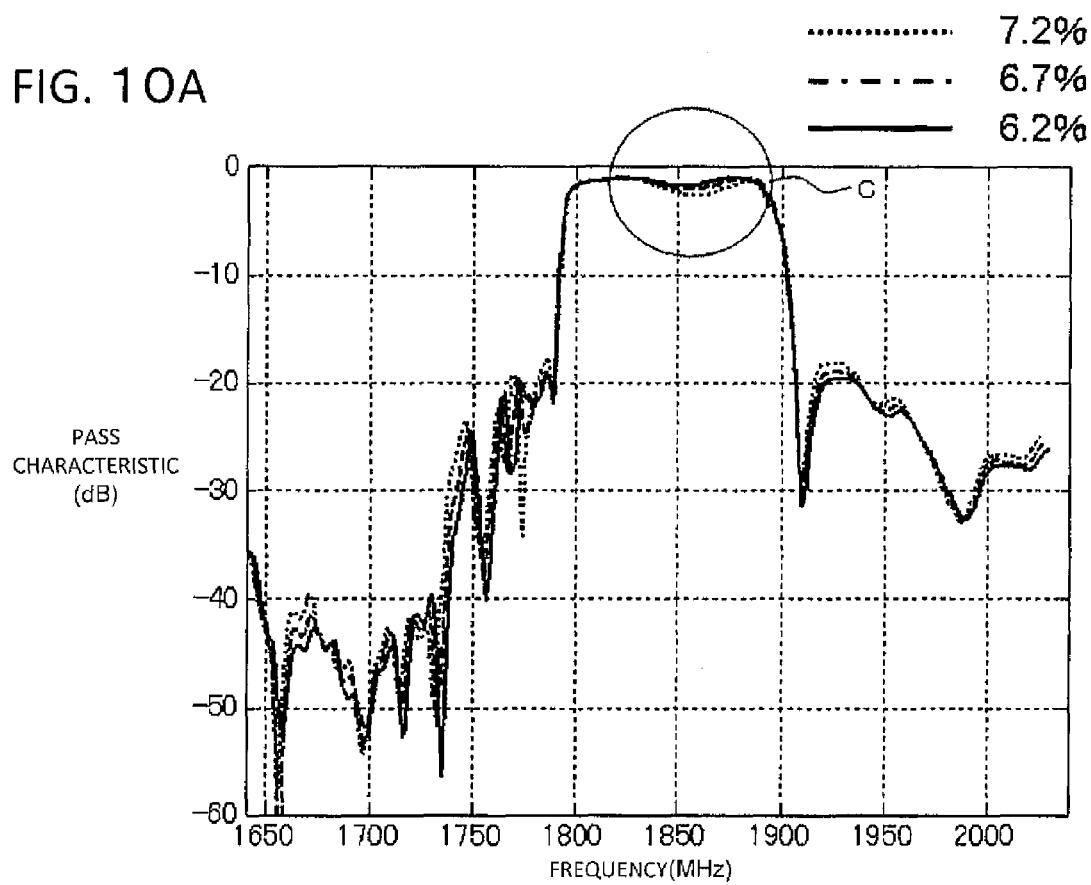
FIG. 10 A graph showing a frequency characteristic of an embodiment with different electrode finger pitches from those of FIG. 5.
Figure 10B:
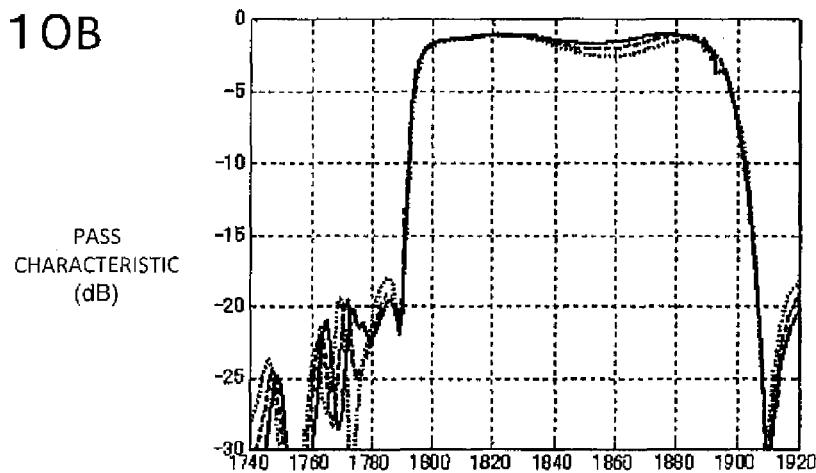

FIG. 10 shows frequency characteristics for still other embodiments. In the same way as the embodiments shown in FIG. 9, the ratio of broadness of the average electrode finger pitch of the electrode finger narrow pitch portions N2 and N3 with respect to the average electrode finger pitch of the electrode finger narrow pitch portions N1 and N4 is different from that in FIG. 5. Note that, FIG. 10B is obtained by enlarging a region C shown in FIG. 10A.

Specifically, FIG. 10 shows the frequency characteristics in cases where the average electrode finger pitch of the electrode finger narrow pitch portions N2 and N3 is broader than the average electrode finger pitch of the electrode finger narrow pitch portions N1 and N4 by 6.2%, 6.7%, and 7.2% of the average electrode finger pitch of the electrode finger narrow pitch portions N1 and N4.

When viewing a range indicated by the region C in the pass band (about 1840 to 1880 MHz), the size of the ripple generated in this region becomes smaller in an order of 7.2%, 6.7%, and 6.2%.

In particular, the reduction of the ripple in a case where the pitch is changed from 7.2% to 6.7% is more conspicuous than the reduction of the ripple in a case where the pitch is changed from 6.7% to 6.2%. Namely, when the pitch becomes about 7.0% or less, the ripple can be kept small, and the insertion loss of the surface acoustic wave device can be made extremely small by that.

From the above measurement results, preferably the average electrode finger pitch of the electrode finger narrow pitch portions N2 and N3 is broader than the average electrode finger pitch of the electrode finger narrow pitch portions N1 and N4 by 1 to 7% of the average electrode finger pitch of the electrode finger narrow pitch portions N1 and N4. By each electrode finger narrow pitch portion satisfying this relationship, a surface acoustic wave device excellent in electric characteristics in which the attenuation in the vicinity of the outside of the lower frequency side of the pass band is sharp and the insertion loss is small can be achieved.

The invention claimed is:

1. A surface acoustic wave device, comprising:
    a piezoelectric substrate;
    a surface acoustic wave element formed on the piezoelectric substrate and comprising
    first to fifth IDT electrodes aligned, in a propagation direction of a surface acoustic wave propagating on the piezoelectric substrate, and each comprising, along the propagation direction, a plurality of electrode fingers long in a direction perpendicular to the propagation direction, and
    reflector electrodes arranged on both sides of the propagation direction of the first to fifth IDT electrodes and each comprising a plurality of electrode fingers long in the direction perpendicular to the propagation direction; and
    an unbalanced signal terminal and balanced signal terminals connected to the surface acoustic wave element,
wherein
    the first to fifth IDT electrodes further comprise a first to fourth electrode finger narrow pitch portions,
    the first to fourth electrode finger narrow pitch portions each comprises a gap between adjoining two IDT electrodes and at least two adjoining electrode fingers of each of the adjoining two IDT electrodes located closer to the gap, and are formed symmetrically around the third IDT electrode located at the center, and
    a pitch of the first electrode finger narrow pitch portion is narrower than a pitch of the second electrode finger narrow pitch portion and a pitch of the fourth electrode finger narrow pitch portion is narrower than a pitch of the third electrode finger narrow pitch portion.

2. The surface acoustic wave device as set forth in claim 1, wherein the unbalanced signal terminal is connected in parallel to the first, third and fifth IDT electrodes, and the balanced signal terminals are connected to the second and fourth IDT electrodes.

3. The surface acoustic wave device as set forth in claim 1, wherein the unbalanced signal terminal is connected in parallel to the second and fourth IDT electrodes, one comb-shaped electrode of the third IDT electrode is divided into two, and one divided portion and the first IDT electrode, and the other divided portion and the fifth IDT electrode are respectively connected to one of the balanced signal terminals.

4. The surface acoustic wave device as set forth in claim 3, further comprising
   a first surface acoustic was resonator being connected between the one divided portion and first IDT electrode and one of the balanced signal terminals, and comprising
      IDT electrodes comprising, along the propagation direction, a plurality of electrode fingers long in the direction perpendicular to the propagation direction and
      reflector electrodes arranged on both sides of the propagation direction of the IDT electrodes and comprising a plurality of electrode fingers long in the direction perpendicular to the propagation direction, and
   a second surface acoustic wave resonator being connected between the other divided portion and fifth IDT electrode and the other of the balanced signal terminals, and comprising
      IDT electrodes comprising, along the propagation direction, a plurality of electrode fingers long in the direction perpendicular to the propagation direction and
      reflector electrodes arranged on both sides of the propagation direction of the IDT electrodes and provided with a plurality of electrode fingers long in the direction perpendicular to the propagation direction.

5. The surface acoustic wave device as set forth in claim 1, further comprising
   a surface acoustic wave resonator being connected between the surface acoustic wave element and the unbalanced signal terminal, and comprising
      IDT electrodes comprising, along the propagation direction, a plurality of electrode fingers long in the direction perpendicular to the propagation direction and
      reflector electrodes arranged on both sides of the propagation direction of the IDT electrodes and comprising a plurality of electrode fingers long in the direction perpendicular to the propagation direction.

6. The surface acoustic wave device as set forth in claim 1, further comprising
   surface acoustic wave resonators being connected between the surface acoustic wave element and the balanced signal terminals, and each comprising
      IDT electrodes comprising, along the propagation direction, a plurality of electrode fingers long in the direction perpendicular to the propagation direction and
      reflector electrodes arranged on both sides of the propagation direction of the IDT electrodes and comprising a plurality of electrode fingers long in the direction perpendicular to the propagation direction.

7. The surface acoustic wave device as set forth in claim 1, wherein the average pitch of the second electrode finger narrow pitch portion is broader than the average pitch of the first electrode finger narrow pitch portion by 1 to 7%.

8. The surface acoustic wave device as set forth in claim 1, wherein the average pitch of the third electrode finger narrow pitch portion is broader than the average pitch of the fourth electrode finger narrow pitch portion by 1 to 7%.

9. A communication device, comprising:
   at least one of a reception circuit and a transmission circuit comprising a surface acoustic wave device, wherein
   the surface acoustic wave device comprises
      a piezoelectric substrate;
      a surface acoustic wave element formed on the piezoelectric substrate and comprising
         a first to a fifth IDT electrodes aligned in a propagation direction of a surface acoustic wave propagating on the piezoelectric substrate, and each comprising, along the propagation direction, a plurality of electrode fingers long in a direction perpendicular to the propagation direction, and
         reflector electrodes arranged on both sides of the propagation direction of the first to fifth IDT electrodes and each comprising a plurality of electrode fingers long in the direction perpendicular to the propagation direction; and
      an unbalanced signal terminal and balanced signal terminals connected to the surface acoustic wave element,
   wherein
      the first to fifth IDT electrodes further comprise a first to fourth electrode finger narrow pitch portions,
      the first to fourth electrode finger narrow pitch portions each comprises a gap between adjoining two IDT electrodes and at least two adjoining electrode fingers of each of the adjoining two IDT electrodes located closer to the gap, and are formed symmetrically around the third IDT electrode located at the center, and
      a pitch of the first electrode finger narrow pitch portion is narrower than a pitch of the second electrode finger narrow pitch portion, and a pitch of the fourth electrode finger narrow pitch portion is narrower than a pitch of the third electrode finger narrow pitch portion.

10. The communication device as set forth in claim 9, the reception circuit comprising
   a branching filter configured for transmitting a reception signal received at an antenna to a reception signal processing circuit side,
   a low noise amplifier configured for amplifying the reception signal, and
   a mixer configured for demultiplexing the reception signal from a carrier frequency.

* * * * *